United States Patent
Granneman et al.

(10) Patent No.: US 6,770,851 B2
(45) Date of Patent: Aug. 3, 2004

(54) METHOD AND APPARATUS FOR THE TREATMENT OF SUBSTRATES

(75) Inventors: Ernst Hendrik August Granneman, Ad Hilversum (NL); Vladimir Ivanovich Kuznetsov, Ax Delft (NL); Arjen Benjamin Storm, Leuven (NL); Herbert Terhorst, Bx Amersfoort (NL)

(73) Assignee: ASM International N.V., Bilthoven (NL)

( * ) Notice: Subject to any disclaimer, the term of this patent is extended or adjusted under 35 U.S.C. 154(b) by 0 days.

(21) Appl. No.: 10/186,269

(22) Filed: Jun. 27, 2002

(65) Prior Publication Data

US 2003/0092231 A1 May 15, 2003

Related U.S. Application Data

(63) Continuation-in-part of application No. PCT/NL00/00964, filed on Dec. 28, 2000.

(30) Foreign Application Priority Data

Dec. 29, 1999 (NL) ............................................. 1013984

(51) Int. Cl.[7] ................................................. F27B 5/14
(52) U.S. Cl. ....................... 219/390; 219/405; 219/411; 118/724; 118/725; 118/50.1; 392/416; 392/418
(58) Field of Search ................................. 219/390, 405, 219/411; 392/416, 418; 118/724, 725, 50.1

(56) References Cited

U.S. PATENT DOCUMENTS

| | | | |
|---|---|---|---|
| 4,738,748 A | | 4/1988 | Kisa |
| 4,860,687 A | | 8/1989 | Frijlink ...................... 118/500 |
| 5,178,639 A | | 1/1993 | Nishi |
| 5,180,273 A | | 1/1993 | Sakaya et al. |
| 5,407,449 A | | 4/1995 | Zinger |
| 5,411,076 A | * | 5/1995 | Matsunaga et al. ......... 165/80.2 |
| 5,431,700 A | * | 7/1995 | Sloan ......................... 29/25.01 |
| 5,464,313 A | | 11/1995 | Ohsawa |
| 5,855,681 A | | 1/1999 | Maydan et al. |
| 6,097,005 A | * | 8/2000 | Akimoto ................... 219/444.1 |
| 6,111,225 A | * | 8/2000 | Ohkase et al. .............. 219/390 |
| 6,183,565 B1 | * | 2/2001 | Granneman et al. ........ 118/725 |
| 6,215,106 B1 | * | 4/2001 | Boas et al. ................. 219/390 |

FOREIGN PATENT DOCUMENTS

| | | |
|---|---|---|
| JP | 361294812 A | 12/1986 |
| JP | 362021237 A | 1/1987 |
| JP | 63-136532 | 8/1988 |
| JP | 402034915 A | 2/1990 |
| JP | 404078130 A | 3/1992 |

\* cited by examiner

Primary Examiner—Shawntina Fuqua
(74) Attorney, Agent, or Firm—Knobbe, Martens, Olson & Bear, LLP

(57) ABSTRACT

In a method and apparatus for the thermal treatment of semiconductor substrates, such as a wafer, a wafer is brought into a heat treatment apparatus wherein the heat treatment apparatus comprises two substantially flat parts parallel to the introduction position of the wafer, between which the wafer is taken in. The first part is heated to a first high temperature and the second part is cooled with the help of cooling means and is at a second temperature lower than 70° C. By controlling the heat conductivity between the wafer and at least one of the parts, the temperature of the wafer can be influenced to such an extent that during a certain period, the wafer takes on a temperature that is comparatively closer to the first, high temperature and then takes on a temperature which is comparatively closer to the second low temperature.

22 Claims, 3 Drawing Sheets

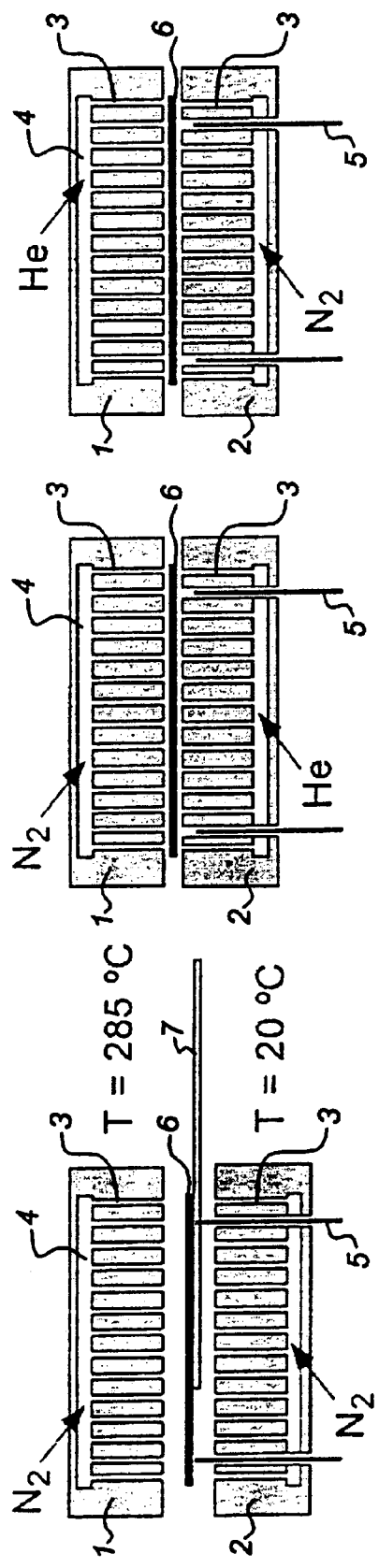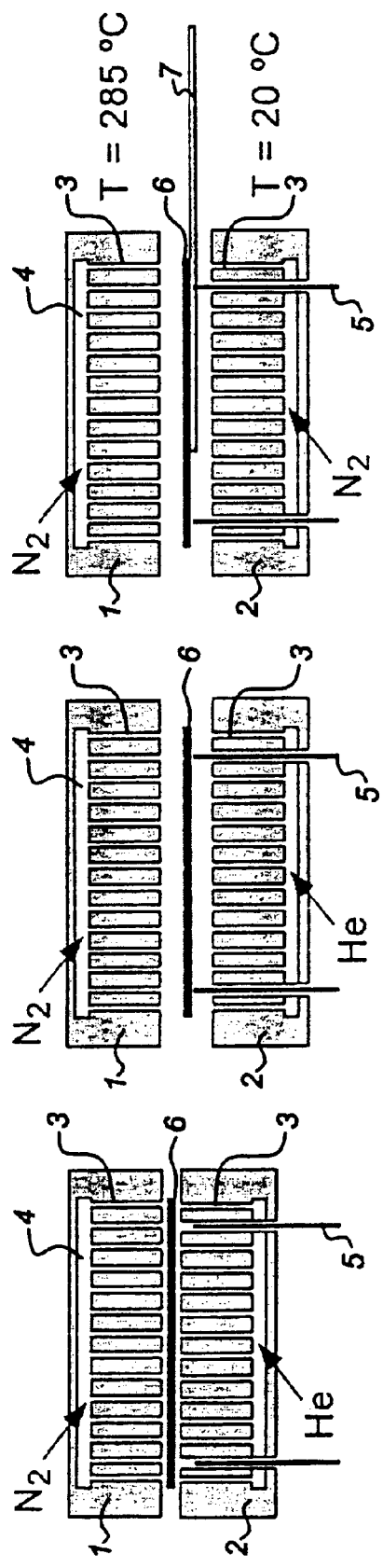

METHOD AND APPARATUS FOR THE TREATMENT OF SUBSTRATES

RELATED APPLICATIONS

This application is a continuation-in-part of International Application No. PCT/NL00/00964 filed on Dec. 28, 2000, designating the U.S. and published in English under PCT Article 21(2) as WO 01/50502 on Jul. 12, 2001. Priority under §120 is thus claimed to International Application No. PCT/NL00/00964 filed Dec. 28, 2000, which is based on Netherlands Patent Application No. 1013984 filed Dec. 29, 1999.

FIELD OF THE INVENTION

The present invention generally relates to a method for the thermal treatment of a substrate, such as a wafer; more particularly, the invention relates to a method comprising the introduction thereof of a substrate in a heat treatment apparatus, wherein the heat treatment apparatus comprises two substantially flat parts parallel to the introduction position of the wafer, between which the wafer is received, wherein the first part is heated and is at a first high temperature and on each of the two sides of the wafer a gas flow is supplied to implement the heat treatment.

BACKGROUND AND SUMMARY OF THE INVENTION

A method for treating a substrate is disclosed in WO 98/01890 of ASM International. It appears that particularly quick warming up is possible when introducing a wafer in such a heat treatment apparatus (floating wafer reactor), as a strong thermal coupling between the wafer and reactor parts can be brought about. For various processes it is important that heating up takes place quickly so that the transition period in which certain reactions continue in an uncontrolled manner is kept as short as possible.

Problems nevertheless occur at the end of a reaction carried out at an elevated temperature. In practice, it has shown to be particularly difficult to cool down wafers in a controlled manner. It is clearly possible to take these out of the reactor and to let them cool down in the air. While such a cooling is reasonably quick, it has been shown that it can cause tensions in the wafer, as the outer edge cools off more quickly than the middle of the wafer. To avoid this problem, it is proposed to position a ring with considerable thermal capacity around the wafer. In this way, an even cooling is realized, but a quick decrease in temperature cannot be realized. It can therefore not be guaranteed that the reaction during various sorts of thermal/chemical treatments can be stopped in a controlled manner after a certain treatment time.

Some embodiments of the present invention seek to avoid these disadvantages and to provide a more accurate controller wherein it is possible to quickly cool down and likewise to heat up, wherein the gradient is manageable in a controlled manner. This is achieved in the method described above in that, during said treatment, the second part is cooled with the help of cooling means and is at a temperature lower than 70° C. and in that, during the treatment, the heat conductance between the wafer and at least one of those parts is controlled in such a way that, during a certain time, the wafer takes on a temperature that is comparatively closer to the first, high temperature and then takes on a temperature which is comparatively closer to the second lower temperature.

It has been found that in a floating wafer reactor and also other constructions wherein the wafer is heated via heat conduction through a gas, a particularly quick heating is possible as the reactor parts can be brought to a very small distance away from the surface of the wafer whereby a strong thermal coupling between the reactor part and wafer occurs. This distance is preferably less than 1 mm and can in particular be less than 0.1 mm. As the heat capacity of the reactor parts is several times larger than the heat capacity of the wafer, when the two reactor parts are at the same temperature, the wafer will take on the temperature of the reactor parts particularly quickly while the temperature of the reactor parts will not noticeably change as a result.

The configuration of the supplied gas flows can be an important factor for achieving this effect. For example, if gas is flowed against a wafer from two sides, when the gases have different heat conduction and the wafer is in the middle between the two parts from which the gas flows, the wafer will be more strongly thermally coupled to the reactor part from which the better conducting gas flows. In a floating wafer reactor, it is comparatively easy to give the opposing parts different temperatures. The wafer will then take the temperature which lies between the temperatures of the two reactor parts. In floating wafer reactors, gas is usually lead through channels in the opposing parts which bound the treatment chamber. Due to the heat capacity of the surrounding material, it is not easy in practice to quickly change the temperature of the gas that flows from a certain part in a controlled manner. However, it is possible to change the gas itself in an easy manner. That is, if in the first situation a good conducting gas is used on one side with low temperature and on the other side with high temperature a less well conducting gas is used, then the substrate will take on a steady temperature which is comparatively closer to the low temperature. If the temperature of the reactor parts is kept the same and the gasses are swapped, that is, that a less well conducting gas is brought into the treatment area via the reactor part which is at a low temperature, and a good conducting gas is brought into the treatment area via the reactor part which is at a higher temperature, then the wafer will heat up particularly quickly. The only change with respect to the original situation is the switching over of the gas type. This same treatment, but then in the opposite direction, can be used starting from that raised temperature, to cool the wafer down particularly quickly.

It has been found that using the embodiment described above a particularly steep temperature gradient can be achieved. It will also be understood that many types of treatment at raised temperature are suitable for this method. This temperature used depends on the treatment and is generally under 400° C. Every gas which meets the desired requirements can be used for this. It is known that the heat conductance of nitrogen is substantially lower than the heat conduction of helium so that, by combining these two inert gasses, quick heating up and then quick cooling down can take place.

The quickest change in temperature of the wafer will be achieved when the switching over of the gas type is carried out abruptly, by instantaneous switching of the gas flows. However, the gases can also be switched more gradually so that the switching occupies a certain period of time. In this way, the temperature ramp rate to which the wafer is subjected during switching can be controlled.

In some embodiments, it is possible to use gasses which in some way cause or influence a chemical reaction. In another embodiment of the invention in which the wafer is kept floating in place by the gas flows coming from the two parts of the reactor, it is possible, instead of or in combination with the method described above, to change the distance of the wafer to the two opposing parts of the floating wafer reactor by controlling the size of the gas flow. It will be understood that if the wafer is very close to one part and at a larger distance from the other part, the effect of this positioning can be compared to the use of a more or less well conducting gas.

Depending on the differences in conduction or other heat capacity, the wafer will take on a temperature which lies somewhere between the temperature of the two spaced parts.

The method described above is very flexible and can be implemented in many types treatments. For example, in copper annealing, a copper layer is annealed after deposition at a temperature of 250° C., for example, to achieve a low resistance of the copper. Annealing times in the range of 1–90 seconds are usual here. Considering the short treatment time, forced cooling of the wafer is desirable to realize sufficient production capacity. It is important to keep the wafer in an inert atmosphere when the wafer temperature is 100° C. or more with the intention of keeping the oxidation of the copper within acceptable limits. For this reason, when a separate cooling station is used, the transport of the wafer from the anneal station to the cooling station should be carried out in an inert atmosphere. In a method according to one embodiment of the invention, a significant simplification and reduction of the apparatus takes place because heating up and cooling down take place in the same reactor chamber and transport of the wafer between times is not necessary. The annealing of low-k dielectric materials at a temperature of 200° C. to approximately 400° C. can be given as another example.

Some embodiments of the invention relate to a heat treatment apparatus comprising two substantially flat parts opposite each other and parallel to the wafer, between which the wafer is received, wherein the first part is provided with heating means to bring this first part to a first high temperature and wherein each of said parts is provided with gas supply channels which open in the area between both parts, characterized in that the second part is provided with cooling means to keep this second part at a second low temperature wherein this temperature is lower than 70° C.

BRIEF DESCRIPTION OF THE DRAWINGS

The invention will be further elucidated with reference to the illustrated embodiments shown in the Figures described below.

FIGS. 1a–f schematically illustrate a method having certain features and advantages of the present invention for annealing of a copper layer applied to a wafer FIGS. 2a–c schematically illustrate another method having certain features and advantages according to the present invention.

DETAILED DESCRIPTION OF THE PREFERRED EMBODIMENT

Figure 2A:
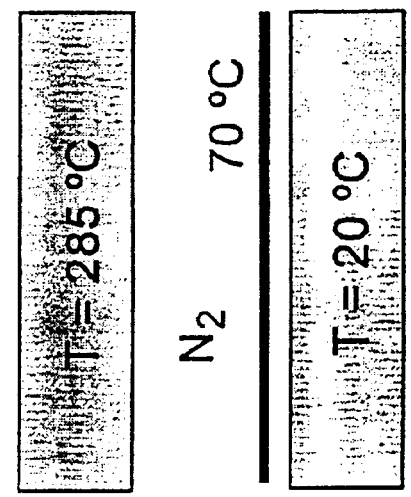

A number of parts of a floating wafer reactor are drawn schematically in FIGS. 1a–f. The parts lying opposite each other are indicated by 1 and 2. A number of channels 3 extend into each of the parts, connected to a central collection point or cabinet 4. This is connected in a manner, not further depicted, to at least two gas sources wherein the control of the related gas is managed through cut-off valves (not shown).

The lower part 2 of the floating wafer reactor is provided with a support organ 5 for a wafer 6 which, with the help of a carrying means 7 such as a ring, is placed on the support organ 5 when the two parts 1 and 2 are at a distance from each other. Then these parts are brought closer to each other while starting the gas flowing as shown in FIG. 1b. The heat treatment then takes place as shown in FIGS. 1b to 1d. After this heat treatment, the two parts 1 and 2 move away from each other again and the treated wafer is supported again by the support organ 5 and then removed by carrying organ 7 as shown in FIGS. 1e and 1f.

When taking in the wafer as shown in FIG. 1a, the upper part 1 of the reactor is for example at a temperature of 285° C. The gas flow through channels 3 of part 1 consists of the comparatively poorly conducting nitrogen. An amount of nitrogen with a temperature of 20° C. is also brought in from the underside. This is the temperature of the lower part 2. The wafer 6 itself is at room temperature. The cold reactor part is provided with cooling means to remove the heat which is transported from the hot reactor part to the cold reactor part. These means can consist of channels, a cooling medium such as cooling water that flows through these channels, and a supply and drain for this cooling medium.

In a preferred embodiment of the invention, the reactor parts are also provided with means to keep the temperature of the parts at a substantially constant value. The temperature of the cold reactor part can be 20° C. but can also have a somewhat lower or higher value up to a maximum of 70° C. to still bring about sufficient cooling of the wafer. In a modified embodiment, the cold reactor part can also be provided with Peltier cooling elements which bring the temperature of the cold reactor part significantly under room temperature, for example 20° C.

After parts 1 and 2 have moved towards each other, the nitrogen gas flow through the lower part is swapped for a helium gas flow. Helium conducts heat considerably better than nitrogen. In this state, the wafer is surrounded from above by the poorly conducting nitrogen gas with comparatively high temperature and from the underside by the comparatively good conducting helium gas with low temperature. As a result, the wafer temperature will be at approximately 70° C.

In the treatment condition shown in FIG. 1c, the gas positions are reversed. That is, good conductor helium is supplied on the top side while the poor conductor nitrogen is supplied from the underside. As a result, the temperature increases very quickly to approximately 250° C. and the heat treatment can take place.

After this heat treatment for a certain time, very quick cooling can be achieved by reversing the gas flows again, that is, supplying the high temperature poor conducting nitrogen gas from the top side and the low temperature good conducting helium gas from the underside. The temperature falls particularly quickly to 70° C. after which the wafer can be removed in the usual way.

Figure 3:
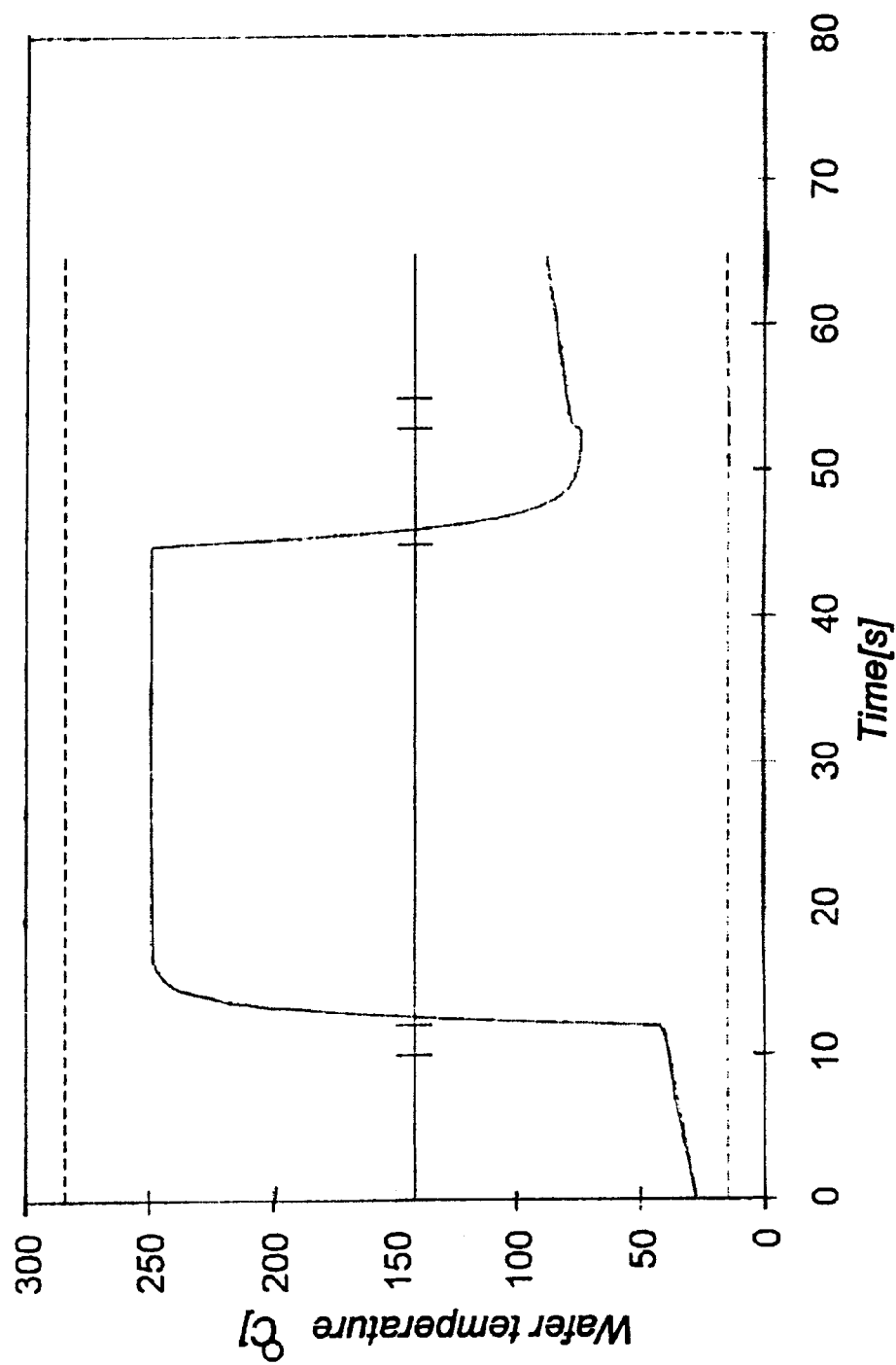
FIG. 3 illustrates the temperature path as a function of time with the construction according to FIG. 1.

A temperature curve that can be achieved using the method and apparatus described above is shown in FIG. 3. During the introduction of the wafer, a gradual temperature increase takes place from room temperature to approximately 70° C. With the reversal of the gas flow a particularly quick increase from approximately 70° C. to 250° C. takes place. After approximately 45 seconds this is followed by a quick cooling.

Figure 2B:
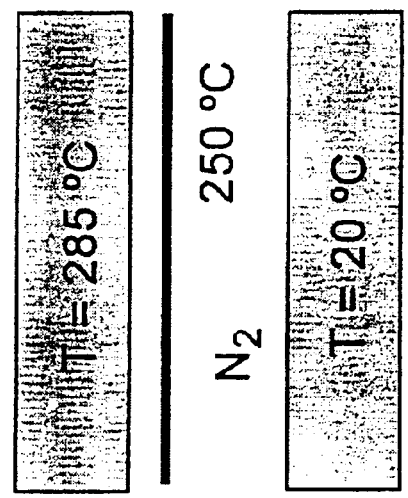
Figure 2C:
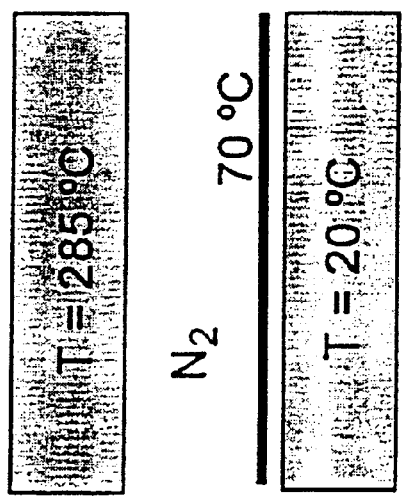

In FIG. 2, a modified embodiment is shown. In this embodiment, use can be made of one gas, such as nitrogen. By letting unequal amounts of gas flow from the two reactor parts, the wafer will move closer to the part through which the smallest amount of gas flows. In this way, as schematically shown in FIG. 2, a higher or lower temperature can be achieved. In the situations of FIGS. 2a and 2c, the gas flow from the lower cold reactor part can be totally switched off, so that the wafer makes mechanical contact with this reactor part.

It should be appreciated that varying of the distance as described above can be used in combination with the above described method of swapping the gases.

Although the invention above is described with reference to a preferred embodiment, it will be understood that many changes can be made to it. Different gasses, gas mixtures and/or temperatures can be used which are several times higher or several times lower than those shown here. In addition, the gasses can take part in the treatment reaction or can promote or inhibit such treatment. All such variants are clear for those skilled in the art after reading the above description and are within the scope of the attached claims.

What is claimed is:

1. A method for heat treatment of a substrate, comprising:
   introducing the substrate into a heat treatment apparatus, wherein the heat treatment apparatus comprises two substantially flat parts parallel to an introduction position of the substrate, between which the substrate is received, wherein a first part of the two substantially flat parts is heated and is at a first high temperature and during at least part of a treatment time on each of two major sides of the substrate a gas flow is supplied to implement heat treatment by heat conduction between the substrate and each of the first and the second parts of the two substantially flat parts through the gas, characterized in that the second part is actively cooled and is at a second lower temperature wherein the second temperature is lower than 70° C.;
   controlling properties of at least one of the supplied gas flows in such a way that, during a determined substrate heating time during the treatment, heat conduction between the substrate and the first part is at a comparatively high value while heat conduction between the substrate and the second part is at a comparatively low value so that the substrate takes on a temperature that is comparatively closer to the first high temperature;
   then controlling properties of at least one of the supplied gas flows in such a way that, during a determined substrate cooling time, heat conduction between the substrate and the first part is at a comparatively low value while heat conduction between the substrate and the second part is at a comparatively high value so that the substrate takes on a temperature which is comparatively closer to the second lower temperature; and
   removing the wafer from the introduction position after the substrate cooling time,
   wherein the substrate first is closer to the second low temperature than the first high temperature, then is closer to the first high temperature than the second low temperature and then is closer to the second low temperature again.

2. A method according to claim 1, having a spacing between each of said parts and said substrate of less than 1 mm.

3. A method according to claim 2, wherein said second part is cooled by flowing cooling water through channels provided in said second part.

4. A method according to claim 1, wherein said second part is cooled by flowing cooling water through channels provided in said second part.

5. A method according to claim 4, characterized in that during said part of the treatment time, the substrate is held in a floating state with the gas flows.

6. A method according to claim 1, characterized in that said parts are maintained at a substantially constant temperature.

7. A method according to claim 6, characterized in that during the treatment the heat transfer properties of at least one of the gas flows is controlled by the changing of the composition of the at least one gas flow.

8. A method according to claim 1, characterized in that during the treatment the heat transfer properties of at least one of the gas flows is controlled by the changing of the composition of the at least one gas flow.

9. A method according to claim 8, wherein said gasses comprise at least one of nitrogen and helium.

10. A method according to claim 1, characterized in that during said part of the treatment time, the wafer is held in a floating state with the gas flows.

11. A method according to claim 10, characterized in that said parts are maintained at a substantially constant temperature.

12. A method for heat treatment of a substrate comprising introduction of the substrate into a heat treatment apparatus, wherein the heat treatment apparatus comprises two substantially flat parts parallel to an introduction position of the substrate, between which the substrate is received, wherein a first part of the two substantially flat parts is heated and is at a first high temperature and during at least part of a treatment time on each of two major sides of the substrate a gas flow is supplied to implement heat treatment by heat conduction between the substrate and each of the first and the second parts of the two substantially flat parts through the gas, characterized in that the second part is actively cooled with help of separate cooling means and is at a second lower temperature wherein the second temperature is lower than 70° C. and in that, during the treatment, the heat conduction between the substrate and each of those parts is controlled by controlling properties of at least one of the supplied gas flows in such a way that, during a determined substrate heating time, heat conduction between the substrate and the first part is at a comparatively high value while heat conduction between the substrate and the second part is at a comparatively low value so that the substrate takes on a temperature that is comparatively closer to the first high temperature and then during a determined substrate cooling time heat conduction between the substrate and the first part is at a comparatively low value while heat conduction between the substrate and the second part is at a comparatively high value so that the substrate takes on a temperature which is comparatively closer to the second lower temperature, characterized in that during said part of the treatment time, the wafer is held in a floating state with the gas flows, characterized in that said parts are maintained at a substantially constant temperature and characterized in that during the treatment the size of the gas flows is controlled to such an extent that the substrate becomes positioned closer to the one than the other part, characterized in that during the treatment the rate of the gas flows is controlled to such an extent that the substrate first is closer to the second part at the second low temperature, then closer to the first part at the first high temperature and then closer to the second part at the second low temperature again.

13. A method according to claim 1, wherein the substrate is a semiconductor wafer.

14. A heat treatment apparatus comprising two substantially flat parts opposite each other and parallel to a wafer, between which the wafer is received, wherein a first part of the two substantially flat parts is provided with heating means to bring the first part to a first high temperature and wherein each of said parts is provided with gas supply channels which open in the area between both parts, characterized in that a second part of the two substantially flat parts is provided with separate cooling means to keep the second part at a second low temperature wherein this temperature is lower than 70° C., and a gas controller is provided to control, during a determined substrate heating time, heat conduction between the substrate and the first part at a comparatively high value and heat conduction between the substrate and the second part at a comparatively low value so that the substrate takes on a temperature that is comparatively closer to the first high temperature and then to control, during a determined substrate cooling time, heat conduction between the substrate and the first part at a comparatively low value and heat conduction between the substrate and the second part at a comparatively high value so that the substrate takes on a temperature which is comparatively closer to the second lower temperature.

15. A heat treatment apparatus according to claim 14, with a spacing between each of said parts and the wafer is no more than 1 mm.

16. A heat treatment apparatus as in claim 15, wherein the spacing between each of said parts and the wafer is less than or equal to 0.1 mm.

17. A heat treatment apparatus according to claim 15, characterized in that the means to control the heat conductivity between the wafer and at least one of said parts during treatment comprises means, connected to at least one of said parts, for the successive supply of various gasses.

18. A heat treatment apparatus according to claim 14, characterized in that the means to control the heat conductivity between the wafer and at least one of said parts during treatment comprises means, connected to at least one of said parts, for the successive supply of various gasses.

19. A heat treatment apparatus according to claim 18, characterized in that said cooling means comprises a Peltier cooling element.

20. A heat treatment apparatus according to claim 14, characterized in that said cooling means comprises a Peltier cooling element.

21. A heat treatment apparatus according to claim 20, wherein said cooling means comprise cooling water channels.

22. A heat treatment apparatus according to claim 14, wherein said cooling means comprise cooling water channels.

\* \* \* \* \*